(12) United States Patent
Lu et al.

(10) Patent No.: US 10,340,190 B2
(45) Date of Patent: Jul. 2, 2019

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Wei-Hao Lu, Taoyuan (TW); Yi-Fang Pai, Hsinchu (TW); Tuoh-Bin Ng, Hsinchu (TW); Li-Li Su, Zhubei (TW); Chii-Horng Li, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/821,969

(22) Filed: Nov. 24, 2017

(65) Prior Publication Data

US 2019/0164835 A1   May 30, 2019

(51) Int. Cl.
*H01L 21/8234* (2006.01)
*H01L 27/088* (2006.01)
*H01L 29/04* (2006.01)
*H01L 29/08* (2006.01)
*H01L 29/167* (2006.01)
*H01L 29/45* (2006.01)
*H01L 21/02* (2006.01)
*H01L 23/535* (2006.01)
*H01L 29/78* (2006.01)

(52) U.S. Cl.
CPC ......... *H01L 21/823418* (2013.01); *H01L 21/02532* (2013.01); *H01L 21/02573* (2013.01); *H01L 21/02609* (2013.01); *H01L 21/823431* (2013.01); *H01L 21/823475* (2013.01); *H01L 23/535* (2013.01); *H01L 27/0886* (2013.01); *H01L 29/045* (2013.01); *H01L 29/0847* (2013.01); *H01L 29/167* (2013.01); *H01L 29/45* (2013.01); *H01L 29/7848* (2013.01)

(58) Field of Classification Search
CPC ............ H01L 29/7853; H01L 29/7848; H01L 29/7842; H01L 29/66795; H01L 29/41791
See application file for complete search history.

(56) References Cited

U.S. PATENT DOCUMENTS

| | | | |
|---|---|---|---|
| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |

(Continued)

*Primary Examiner* — Changhyun Yi
(74) *Attorney, Agent, or Firm* — Birch, Stewart, Kolasch & Birch, LLP

(57) ABSTRACT

Structures and formation methods of a semiconductor device structure are provided. The semiconductor device structure includes a first fin structure and a second fin structure over a substrate. The semiconductor device structure also includes a gate structure over the first and second fin structure. The semiconductor device structure further includes a source/drain structure over the first and second fin structure. The source/drain structure includes a first semiconductor layer over the first fin structure and a second semiconductor layer over the second fin structure. The source/drain structure also includes a third semiconductor layer covering the first and second semiconductor layers. The third semiconductor layer has a surface with [110] plane orientation.

20 Claims, 12 Drawing Sheets

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2014/0054648 A1* | 2/2014 | Itokawa .............. H01L 29/7853 257/192 |
| 2015/0206939 A1* | 7/2015 | Huang .............. H01L 29/66628 257/77 |

* cited by examiner

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a semiconductor device with fin field-effect transistors (FinFETs), has been introduced to replace planar transistors. These relatively new types of semiconductor IC devices face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
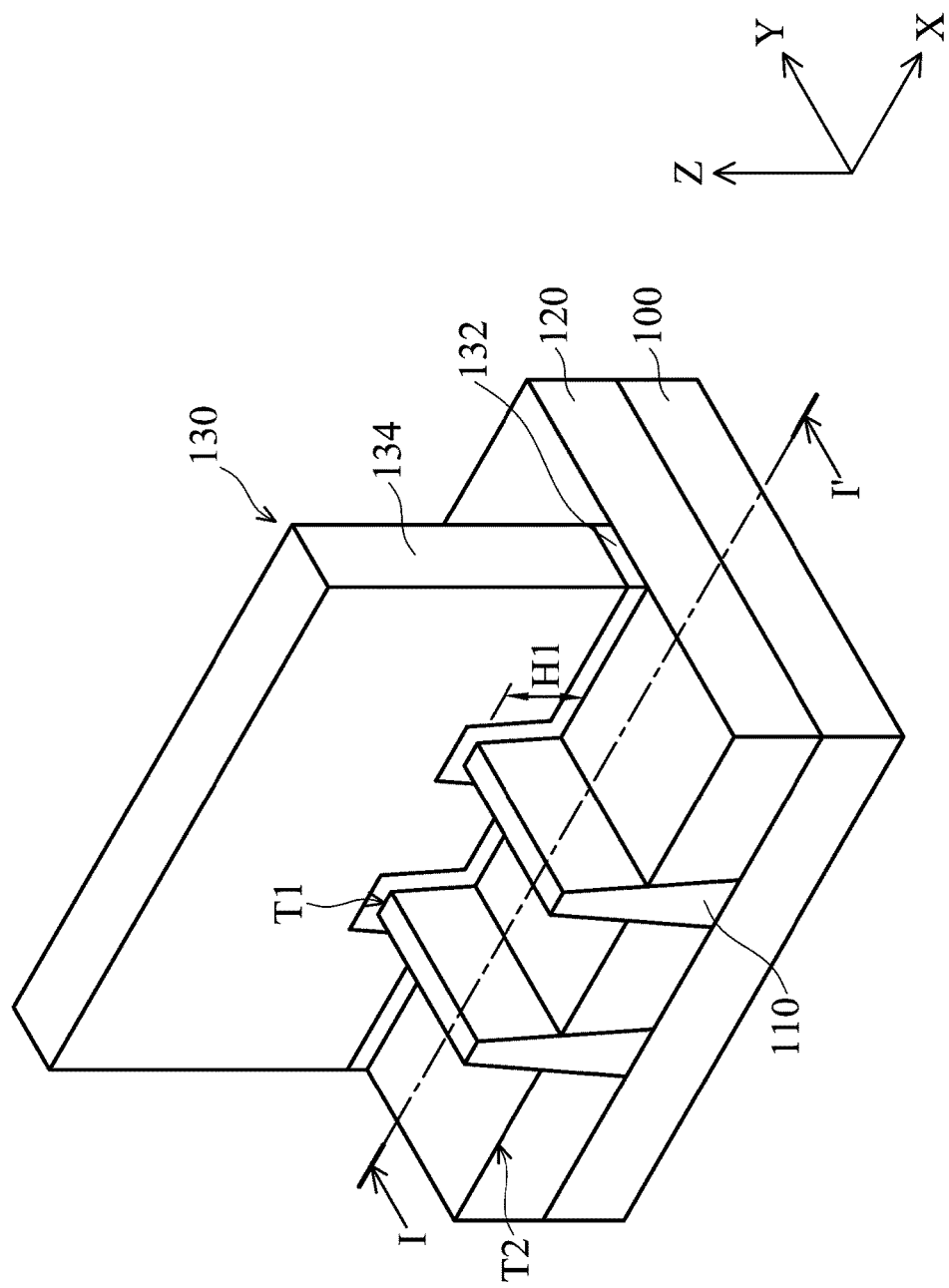
FIG. 1 is a perspective view of one stage of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure form a semiconductor device structure. Some embodiments of the disclosure are described. FIG. 1 is a perspective view of one stage of a process for forming a semiconductor device structure, in accordance with some embodiments. For a better understanding of the semiconductor device structure, an X-Y-Z coordinate reference is provided in FIG. 1. The X-axis is generally orientated along a substrate surface of a semiconductor device structure in the lateral direction. The Y-axis is generally oriented along the substrate surface perpendicular to the X-axis. The Z-axis is generally oriented along direction perpendicular to the X-Y plane.

FIGS. 2A-2I and FIGS. 3A-3B are cross-sectional views of various stages of a process for forming a semiconductor device structure, in accordance with some embodiments. In some embodiments, FIGS. 2A-2I and FIGS. 3A-3B are cross-sectional views taken along line I-I' shown in FIG. 1. Line I-I' may be substantially parallel to the X-axis. More specifically, FIGS. 2A-2J and FIGS. 3A-3B illustrate the cross-sectional views of fin structures, source/drain structure, silicide layer and contact which are discussed in more detail below.

Additional operations can be provided before, during, and/or after the stages described in FIG. 1 and FIGS. 2A-2I and FIGS. 3A-3B. Some of the stages that are described can be replaced or eliminated for different embodiments. Additional features can be added to the semiconductor device structure. Some of the features described below can be replaced or eliminated for different embodiments.

Figure 2A:
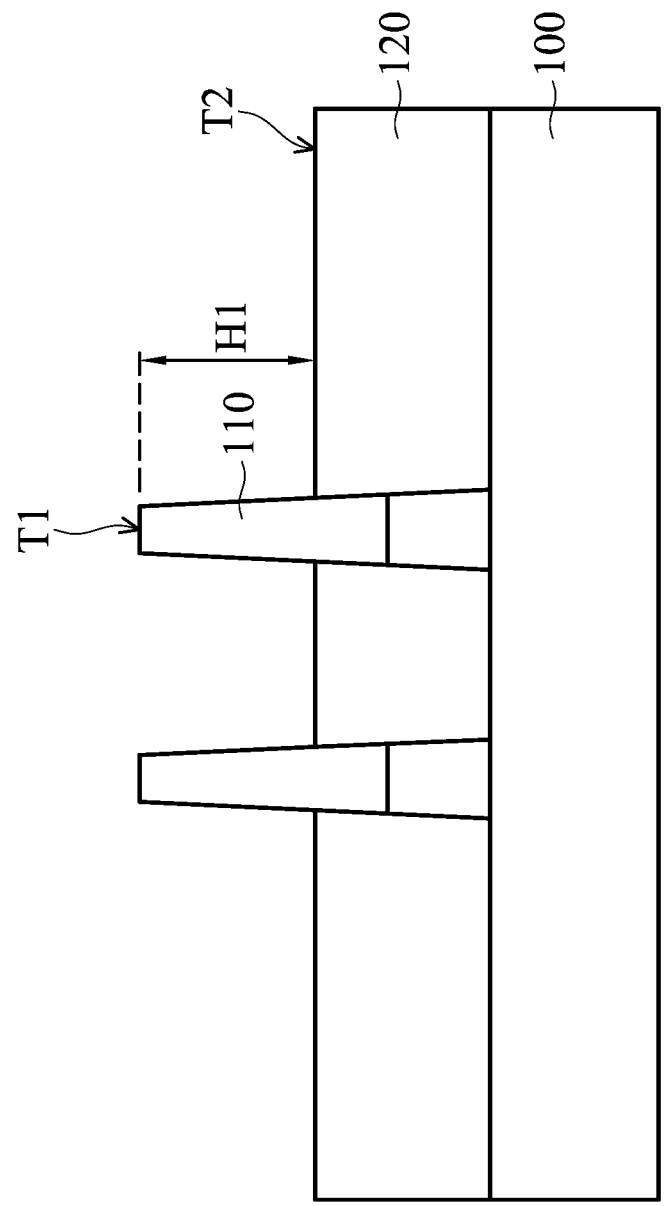
FIGS. 2A-2I are cross-sectional views of various stages of a process for forming a semiconductor device structure, in accordance with some embodiments.

As shown in FIGS. 1 and 2A, a semiconductor substrate 100 is provided. The surface of the semiconductor substrate 100 is substantially parallel to the X-Y plane. In some embodiments, the semiconductor substrate 100 may be a semiconductor wafer such as a silicon wafer. Alternatively or additionally, the semiconductor substrate 100 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

As shown in FIGS. 1 and 2A, multiple fin structures 110 are over the semiconductor substrate 100, in accordance with some embodiments. The fin structures 110 extend along the Y-axis and are arranged in a direction that is substantially parallel to the X-axis, as shown in FIGS. 1 and 2A.

The fin structures 110 may be patterned by any suitable method. For example, the fin structures 110 may be patterned using one or more photolithography processes, including double-patterning or multi-patterning processes. Generally, double-patterning or multi-patterning processes combine photolithography and self-aligned processes, allowing patterns to be created that have, for example, pitches that are smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 110 and form recesses of the semiconductor substrate 100.

As shown in FIGS. 1 and 2A, isolation features 120 are formed in the recesses of the semiconductor substrate 100 to surround lower portions of the fin structures 110, in accordance with some embodiments. The isolation features 120 are used to define and electrically isolate various device elements formed in and/or over the semiconductor substrate 100. In some embodiments, the isolation features 120 include shallow trench isolation (STI) features, local oxidation of silicon (LOCOS) features, other suitable isolation features, or a combination thereof.

In some embodiments, the isolation features 120 are made of a dielectric material. The dielectric material may include silicon oxide, silicon nitride, silicon oxynitride (SiON), spin-on glass, low-K dielectric material, another suitable material, or a combination thereof. In some embodiments, each of the isolation features 120 has a multi-layer structure.

In some embodiments, a dielectric material layer is deposited over the semiconductor substrate 100. The dielectric material layer covers the fin structures 110 and fills the recesses between the fin structures 110. In some embodiments, the dielectric material layer is deposited using a chemical vapor deposition (CVD) process, a spin-on process, another applicable process, or a combination thereof. In some embodiments, a planarization process is performed to thin down the dielectric material layer until the top surfaces of the fin structures 110 are exposed. The planarization process may include a chemical mechanical polishing (CMP) process, a grinding process, an etching process, another applicable process, or a combination thereof. Afterwards, the dielectric material layer is etched back to form the isolation features 120. The fin structures 110 protrude from the isolation features 120, as shown in FIGS. 1 and 2A in accordance with some embodiments.

As shown in FIGS. 1 and 2A, the fin structures 110 have a first height H1 from top surfaces T1 of the fin structures 110 to top surfaces T2 of the isolation features 120, as shown in FIGS. 1 and 2A, in accordance with some embodiments.

As shown in FIG. 1, a gate structure 130 is formed over the semiconductor substrate 100, in accordance with some embodiments. The gate structure 130 partially covers multiple fin structures 110 and multiple isolation features 120. In some embodiments, the gate structure 130 extends along the X-axis as shown in FIG. 1. The gate structure 130 may be a dummy or sacrificial gate structure, which will be removed in a subsequent process.

In some embodiments, the gate structure 130 includes a gate dielectric layer 132 and a gate electrode 134. The gate dielectric layer 132 extends over the fin structures 110 and the isolation features 120. In some embodiments, the gate dielectric layer is a sacrificial or dummy gate dielectric layer and will be replaced with another gate dielectric layer. In some embodiments, the gate dielectric layer is made of a high-K dielectric material. Examples of high-K dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, and combinations thereof.

The gate electrode 134 is formed over the gate dielectric layer. In some embodiments, the gate electrode 134 includes a polysilicon, a metal material, another suitable conductive material, or a combination thereof. In some embodiments, the gate electrode 134 is a sacrificial or dummy gate electrode layer and will be replaced with another conductive material such as a metal material. The sacrificial gate electrode layer is made of a sacrificial material, for example, polysilicon.

Figure 2B:
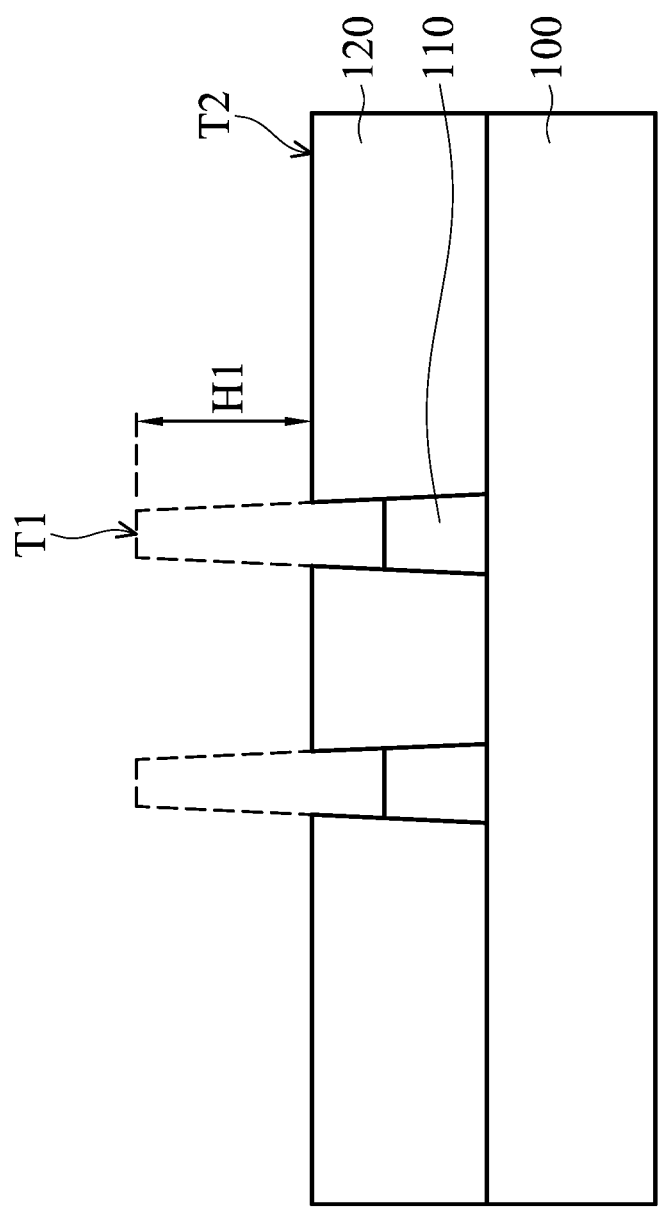

Next, a portion of the fin structures 110 not covered by the gate structure 130 is etched to form recesses, as shown in FIG. 2B in accordance with some embodiments. It is appreciated that although the fin structures 110 along line I-I' are etched so that top surfaces of the fin structures 110 along line I-I' are lower than the top surfaces T2 of the isolation features 120, the fin structures 110 covered by the gate structure 130. As a result, the fin structures 110 have top surface T1 covered by the gate structure 130. As shown in FIG. 2B, the profile of the fin structures 110 covered by the gate structure 130 is illustrated by a dashed line.

In some embodiments, one or more etching processes are performed to recess and remove the upper portions of the fin structures 110 not covered by the gate structure 130. Therefore, the top surfaces of the fin structures 110 not covered by the gate structure 130 are lower than the top surfaces T2 of the isolation features 120, and the fin structures 110 covered by the gate structure 130 have first height H1 from the top surface T1 to the top surface T2 of the isolation features 120. More specifically, the fin structures 110 have the top surfaces T1 directly under the gate structure 130, and the distance between the top surfaces T1 directly under the gate structure 130 and the top surface T2 of the isolation features 120 is equal to the first height H1. The etching processes may be a dry etching process, another applicable process, or a combination thereof.

Figure 2C:
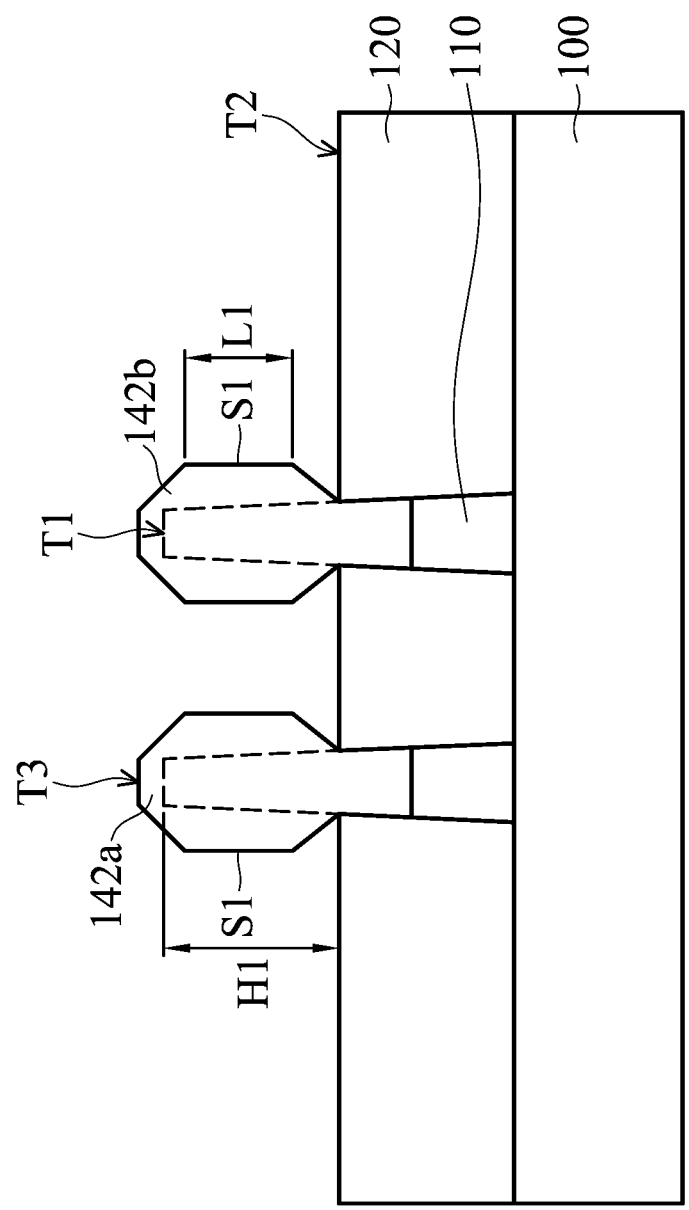

A semiconductor layer 142a and a semiconductor layer 142b are epitaxially grown in the recesses of the fin structures 110 and over the isolation features 120, as shown in FIG. 2C in accordance with some embodiments. In some embodiments, top surfaces T3 of the semiconductor layer 142a and the semiconductor layer 142b are higher than the top surfaces T1 of the fin structures 110.

In some embodiments, the semiconductor layer 142a and the semiconductor layer 142b are a P-type semiconductor material. In some embodiments, the semiconductor layer 142a and the semiconductor layer 142b are an N-type semiconductor material.

In some embodiments, the semiconductor layer 142a and the semiconductor layer 142b are formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof.

The formation process of the semiconductor layer 142a and the semiconductor layer 142b may use gaseous and/or liquid precursors. In some embodiments, during the formation of the semiconductor layer 142a and the semiconductor layer 142b, a dopant is introduced or supplied to a reaction chamber (not shown) so that the semiconductor layer 142a and the semiconductor layer 142b have a first dopant concentration of a dopant. In some embodiments, the dopant includes P, As, B, Al or Ga.

In some embodiments, the P-containing precursor is introduced or supplied to a reaction chamber so that the semiconductor layer 142a and the semiconductor layer 142b have a first dopant concentration of P. In some embodiments, the first dopant concentration of P is in a range of about $1 \times 10^{20}/cm^3$ to about $5 \times 10^{21}/cm^3$. In some embodiments, the P-containing precursor includes $PH_3$, and the flow rate of the $PH_3$ is in a range of about 100 sccm to about 400 sccm.

In some embodiments, during the formation of the semiconductor layer 142a and the semiconductor layer 142b, the temperature in the reaction chamber is in a range of about 400° C. to about 700° C. so that the semiconductor layer 142a and the semiconductor layer 142b have surfaces S1 with [110] plane orientation, as shown in FIG. 2C. As shown in FIG. 2C, the surfaces S1 are located in two opposite sides of the semiconductor layer 142a and the semiconductor layer 142b respectively, and the width of the semiconductor layer 142a and the semiconductor layer 142b is defined by the distance between these two opposite surfaces S1. Since the surfaces S1 with [110] plane orientation are substantially parallel to the Z-axis, the width along the XY-plane can be decreased, and the shape of the semiconductor layer 142a and the semiconductor layer 142b can be controlled easily. Moreover, the formation of the surfaces S1 with [110] plane orientation may assist in forming the source/drain structure with surfaces with [110] plane orientation in two opposite sides.

In some cases, during the formation of the semiconductor layer 142a and the semiconductor layer 142b, the temperature in the reaction chamber should not be greater than 700° C. If the temperature is greater than 700° C., the surfaces with [111] plane orientation may be formed in two opposite sides of the semiconductor layer. The surface with [111] orientation extends along the XYZ-plane. Therefore, the formation of the surface with [111] plane orientation may increase the width of the semiconductor layer along the XY-plane. Moreover, the surface with [111] plane orientation may cause asymmetry between the semiconductor layer 142a and the semiconductor layer 142b. Therefore, the shape of the subsequently formed source/drain structure is hard to control. In some cases, the temperature in the reaction chamber should not be lower than 400° C. If the temperature is lower than 400° C., the growth rate of growing the semiconductor layer may be too slow. In some embodiments, the semiconductor layer 142a and the semiconductor layer 142b are grown at a temperature in a range of about 450 t to about 600° C.

The surfaces S1 have a first length L1, as shown in FIG. 2C in accordance with some embodiments. In some embodiments, the ratio of the first length L1 to the first height H1 is in a range of about 40% to about 70%. If the ratio of the first length L1 to the first height H1 is in a range of about 40% to about 70%, the subsequently formed semiconductor layer 144 may be formed with wavy-shaped top surface which produces a greater interface between the contact and the source/drain structure.

Figure 2D:
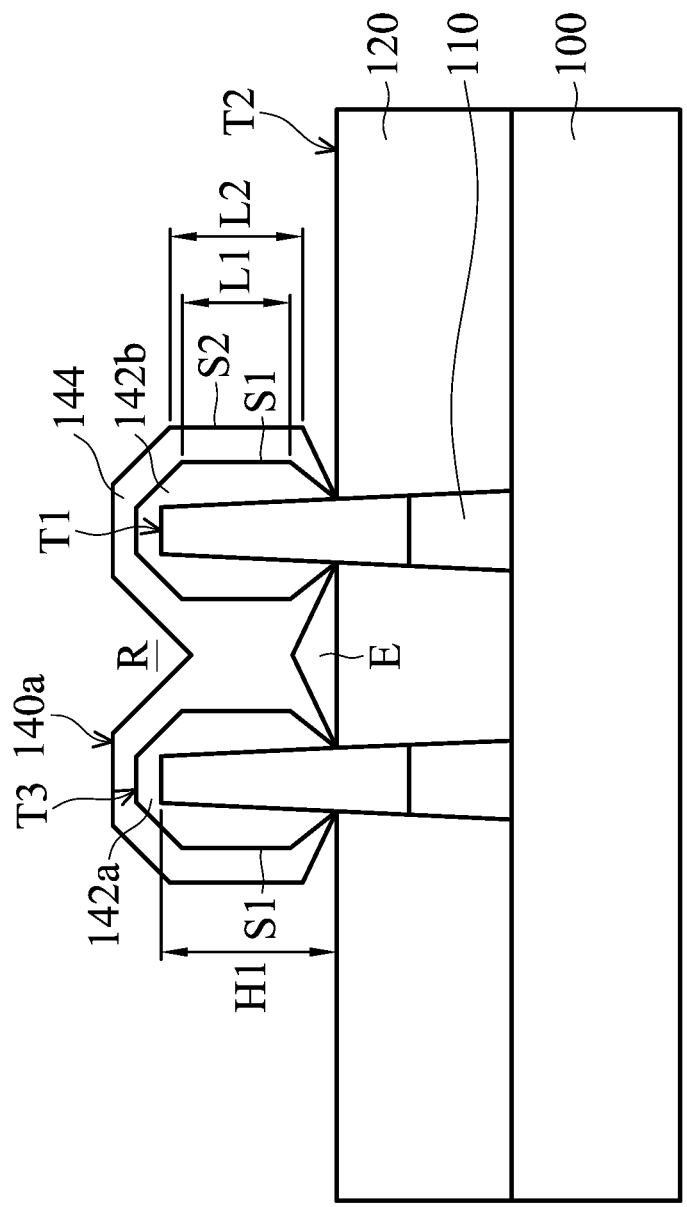

Next, a semiconductor layer 144 is epitaxially grown to cover the semiconductor layer 142a and the semiconductor layer 142b, as shown in FIG. 2D in accordance with some embodiments. In some embodiments, as shown in FIG. 2D, the semiconductor layer 142a is separated from the semiconductor layer 142b by the semiconductor layer 144, and the semiconductor layer 144 adjoins the semiconductor layer 142a and the semiconductor layer 142b. In some embodiments, a space E is formed, and the space E is surrounded by the semiconductor layer 144 and the isolation features 120, as shown in FIG. 2D.

In some embodiments, the semiconductor layer 144 is grown in-situ in the same process chamber used for epitaxially growing the semiconductor layer 142a and the semiconductor layer 142b. In some other embodiments, the semiconductor layer 144 is grown in a different process chamber where the semiconductor layer 142a and the semiconductor layer 142b are epitaxially grown.

The formation process of the semiconductor layer 144 may use gaseous and/or liquid precursors. In some embodiments, during the formation of the semiconductor layer 144, the dopant is introduced or supplied to the reaction chamber so that the semiconductor layer 144 has a second dopant concentration of a dopant. In some embodiments, the second dopant concentration of the dopant is greater than the first dopant concentration of the dopant.

In some embodiments, the semiconductor layer 142a, the semiconductor layer 142b and the semiconductor layer 144 form a source/drain (S/D) structure 140a. The S/D structure 140a may be used to provide stress or strain to channel regions in the fin structures 110 below the gate structure 130. As a result, the carrier mobility of the semiconductor device structure and device performance are improved. Many variations and/or modifications can be made to embodiments of the disclosure. In some embodiments, the source/drain structure 140a includes more semiconductor layers, and each of the semiconductor layer may have different dopant concentration of the dopant.

As shown in FIGS. 1 and 2D, the S/D structure 140a is grown over portions of the fin structure 110 not covered by the gate structure 130, and the S/D structure 140a has the recess R between the semiconductor layer 142a and the semiconductor layer 142b. In some embodiments, the bottom of the recess R is lower than the top surface T1 of the fin structure 110 covered by the gate structure 130.

In some embodiments, the P-containing precursor is introduced or supplied to a reaction chamber so that the semiconductor layer 144 has a second dopant concentration of P. In some embodiments, the second dopant concentration of P is greater than the first dopant concentration of P. In some embodiments, the second dopant concentration of P is in a range of about $1 \times 10^{20}/cm^3$ to about $10 \times 10^{22}/cm^3$. In some embodiments, the P-containing precursor includes $PH_3$, and the flow rate of the $PH_3$ is in a range of about 100 sccm to about 400 sccm. For example, the semiconductor layer 142a, the semiconductor layer 142b and the semiconductor layer 144 are made of SiP, and the dopant concentration of P of the semiconductor layer 144 is greater than that of the semiconductor layer 142a, the semiconductor layer 142b.

In some embodiments, during the formation of the semiconductor layer 144, the temperature in the reaction chamber is in a range of about 400° C. to about 700° C. so that the semiconductor layer 144 have surfaces S2 with [110] plane orientation, as shown in FIG. 2D. As shown in FIG. 2D, the surfaces S2 are located in two opposite sides of the semiconductor layer 144, and the width of the S/D structure 140a is defined by the distance between these two opposite surfaces S2. Since the surfaces S2 with [110] plane orientation are substantially parallel to the Z-axis, the width of the S/D structure 140a along the XY-plane can be decreased, and the shape of the S/D structure 140a can be controlled easily.

In some cases, during the formation of the semiconductor layer 144, the temperature in the reaction chamber should not be greater than 700° C. If the temperature is greater than 700° C., the surfaces with [111] plane orientation may be formed. The formation of a surface with [111] plane orientation may increase the width of the S/D structure. Moreover, the surface with [111] plane orientation formed on two opposite side surfaces of the S/D structure may cause the shape of the S/D structure to be asymmetrical. As a result, the critical dimension (CD) uniformity may become worse. As a result, the manufacturing yield of the semiconductor device structure may be decreased. In some cases, the temperature in the reaction chamber should not be lower than 400° C. If the temperature is lower than 400° C., the growth rate of the semiconductor layer may be too slow. In some embodiments, the semiconductor layer 144 is grown at a temperature in a range of about 450 t to about 600° C.

The surfaces S2 have a second length L2, as shown in FIG. 2D in accordance with some embodiments. In some embodiments, the ratio of the second length L2 to the first height H1 is in a range of about 50% to about 80%. If the ratio of the second length L2 to the first height H1 is in a range of about 50% to about 80%, the S/D structure 140a may be formed with a recess R which produces a greater interface between the contact and the S/D structure 140a.

In some embodiments, as shown in FIG. 2D, the recess R is formed between the semiconductor layer 142a and the semiconductor layer 142b. As shown in FIG. 2D, the recess R has tapered sidewalls. In some embodiments, the bottom of the recess R is lower than the top surfaces T3 of the semiconductor layer 142a and the semiconductor layer 142b. In some embodiments, the bottom of the recess R is lower than the top surface T1 of the fin structure 110 covered by the gate structure 130. When the depth of the recess R is increased, the wavy-shaped recess R can provide an interface between the S/D structure and subsequently formed contact with greater area. Therefore, the contact resistance can be decreased, and thereby improving the performance of the semiconductor device structure.

In some embodiments, during the growing of the S/D structure 140a, the Si-containing precursor and HCl are introduced or supplied to the reaction chamber. For example, dimethylsilane (DCS) may be used as the Si-containing precursor. The flow rate of DCS is in a range of about 700 sccm to about 1200 sccm, and the flow rate of the HCl is in a range of about 30 sccm to about 300 sccm.

Figure 2E:
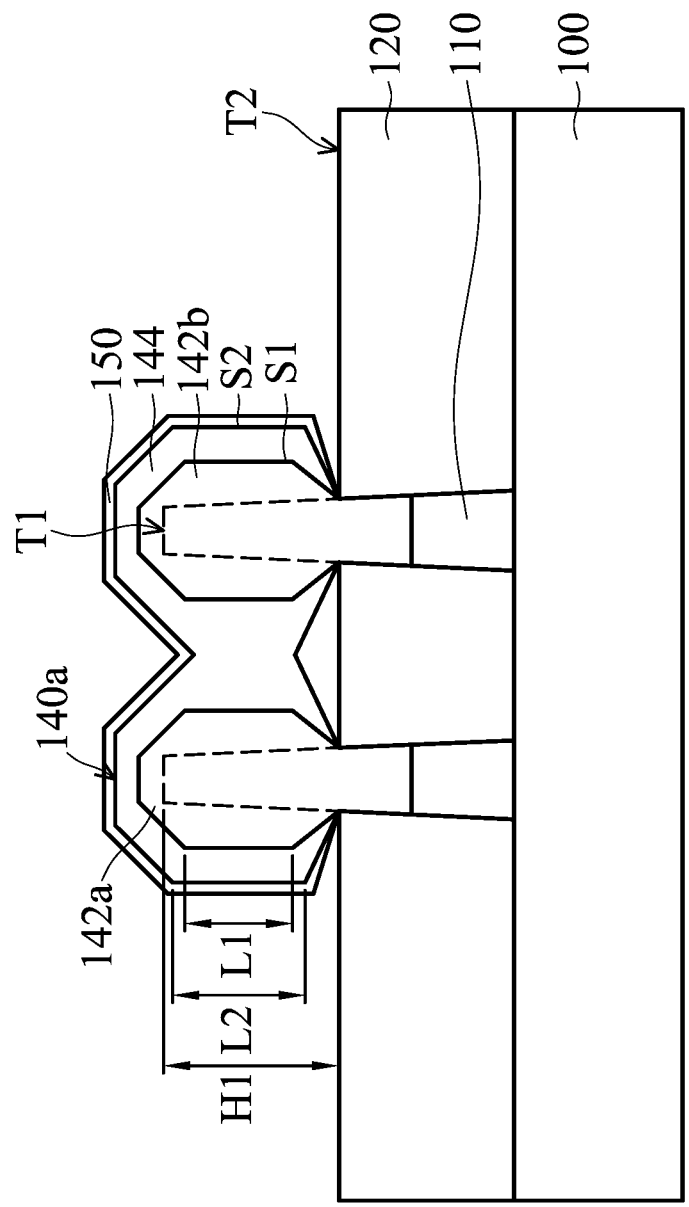

A capping layer 150 is formed to cover the S/D structure 140a, as shown in FIG. 2E in accordance with some embodiments. In some embodiments, the capping layer 150 is in direct contact with the S/D structure 140a. The capping layer 150 is used to protect the S/D structure 140a from damage during the depositing of subsequently formed dielectric layer. The capping layer 150 may contain an insulating material including group-IV element, a group-V element, and/or a group-VI element. In some embodiments, the capping layer 150 is made of silicon nitride, silicon oxynitride, silicon carbide, silicon oxycarbide (SiOC) or a combination thereof.

Many variations and/or modifications can be made to embodiments of the disclosure. In some other embodiments, the capping layer 150 is doped with the element with a dopant concentration that is lower than that of the semiconductor layer 144. In this embodiment, the capping layer 150 is used as a buffer layer to prevent from leakage due to the large difference of the dopant concentration in an interface between the S/D structure 140a and subsequently formed dielectric layer. In some embodiments, the capping layer 150 is not formed.

Figure 2F:
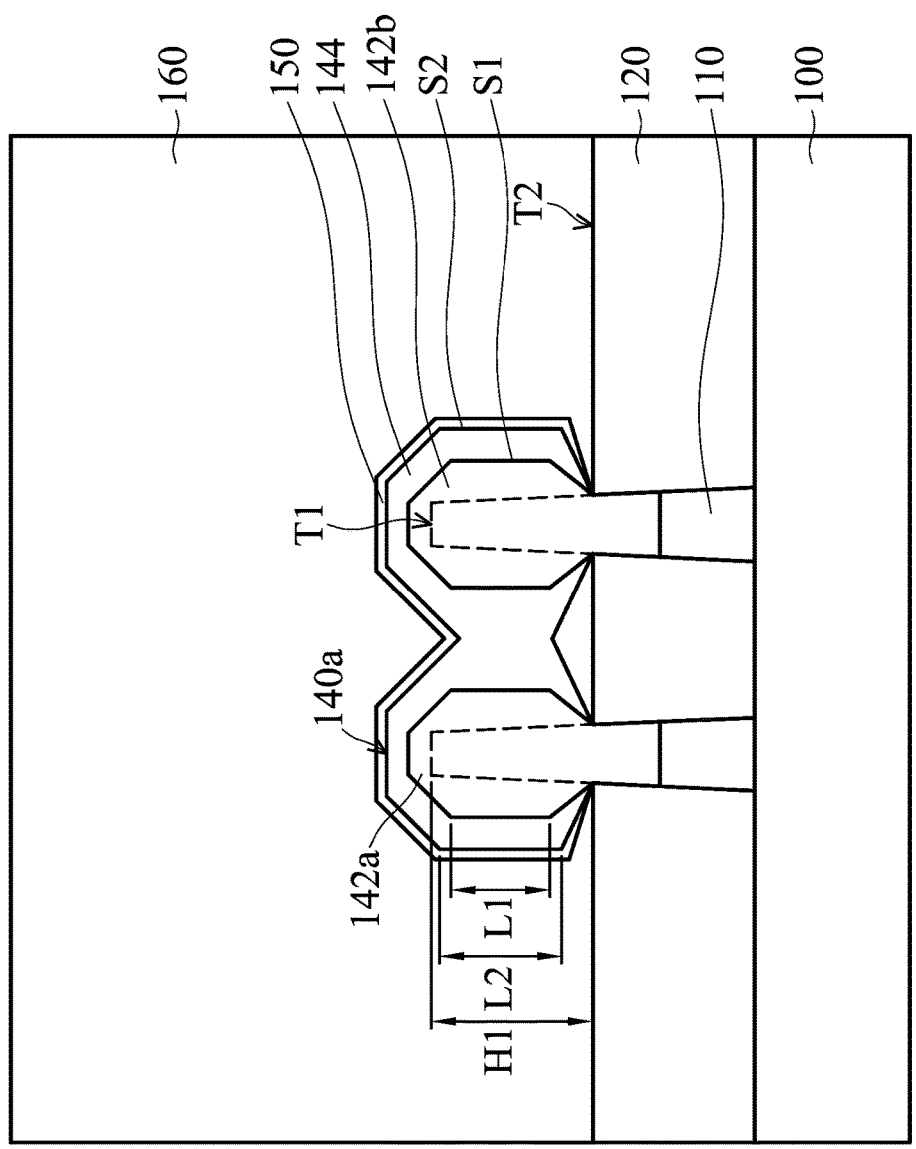

Next, a dielectric layer 160 is deposited, as shown in FIG. 2F in accordance with some embodiments. As shown in FIG. 2F, the dielectric layer 160 covers the capping layer 150 and the S/D structure 140a. In some embodiments, the dielectric layer 160 includes silicon oxide, silicon oxynitride, borosilicate glass (BSG), phosphosilicate glass (PSG), borophosphosilicate glass (BPSG), fluorinated silicate glass (FSG), low-K material, porous dielectric material or a combination thereof. The material of the dielectric layer 160 is selected to minimize propagation delays and crosstalk between nearby conductive features. In some embodiments, the dielectric layer 160 is deposited using a flowable CVD process, a spin-on process, an ALD process, a PVD process, another applicable process, or a combination thereof.

Figure 2G:
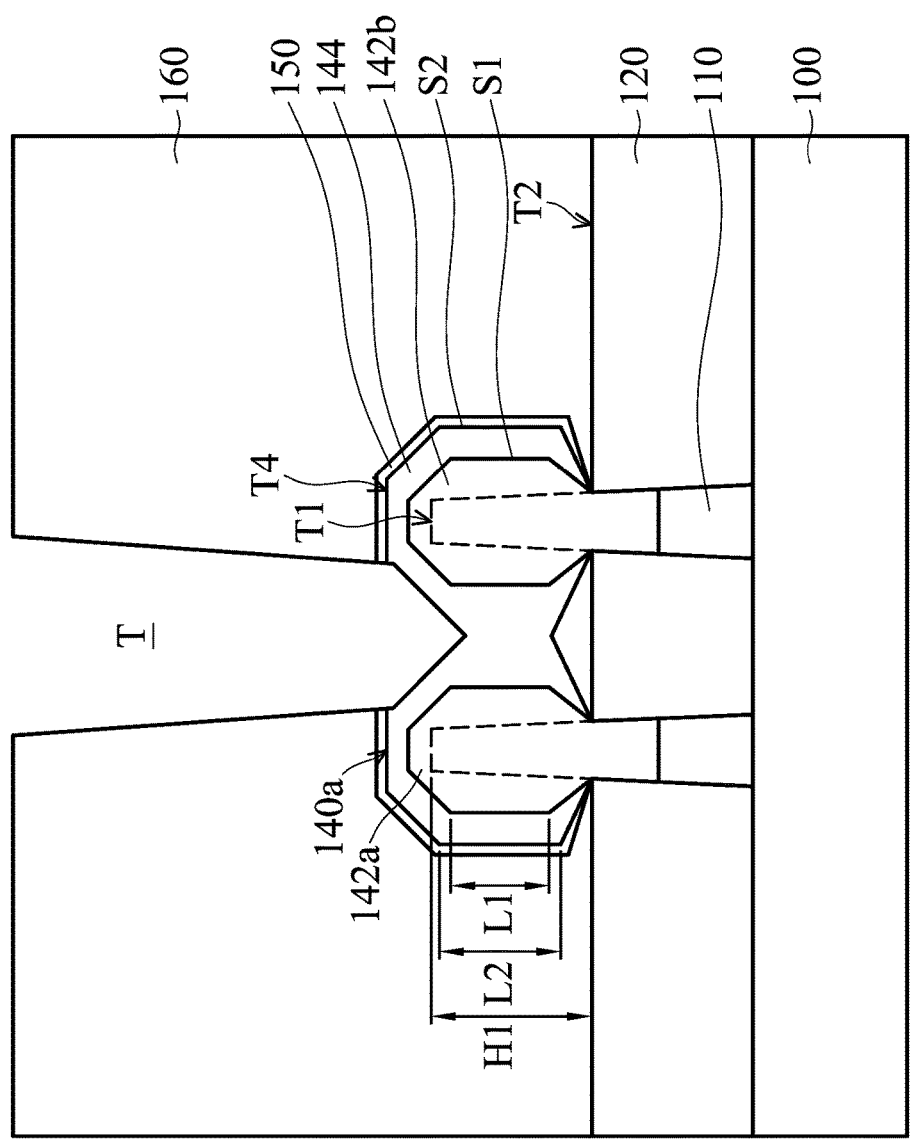

After the dielectric layer 160 is deposited, an etching process is performed to form a trench (or openings) T in the dielectric layer 160, as shown in FIG. 2G in accordance with some embodiments. In some embodiments, the dielectric layer 160, a portion of the capping layer 150 and the S/D structure 140a are etched during the etching process, as shown in FIG. 2G. In some embodiments, the top portion of the S/D structure 140a and the capping layer 150 over the recess R of the S/D structure 140a are etched. As a result, the trench T may have a V-shaped in the bottom portion. As shown in FIG. 2G, the remained S/D structure 140a is exposed by the dielectric layer 160, and the remained capping layer 150 is covered by the dielectric layer 160.

Many variations and/or modifications can be made to embodiments of the disclosure. In some embodiments, a portion of the capping layer 150 over top surfaces T4 of the semiconductor layer 144 is removed during the etching process, and the trench T covers the top surfaces T1 of the fin structures 110.

In some embodiments, the etching process includes a dry etching process. In some embodiments, the dry etching process includes a plasma etching process or another applicable etching process. In some embodiments, the etchant used in the etching process contains carbon, chlorine and fluorine. For example, the etchant used in the etching process may include chlorine ($Cl_2$), tetrafluoromethane ($CF_4$), fluoromethane ($CH_3F$), hexa-fluoro-butadiene ($C_4F_6$), or another suitable etching gas.

Figure 2H:
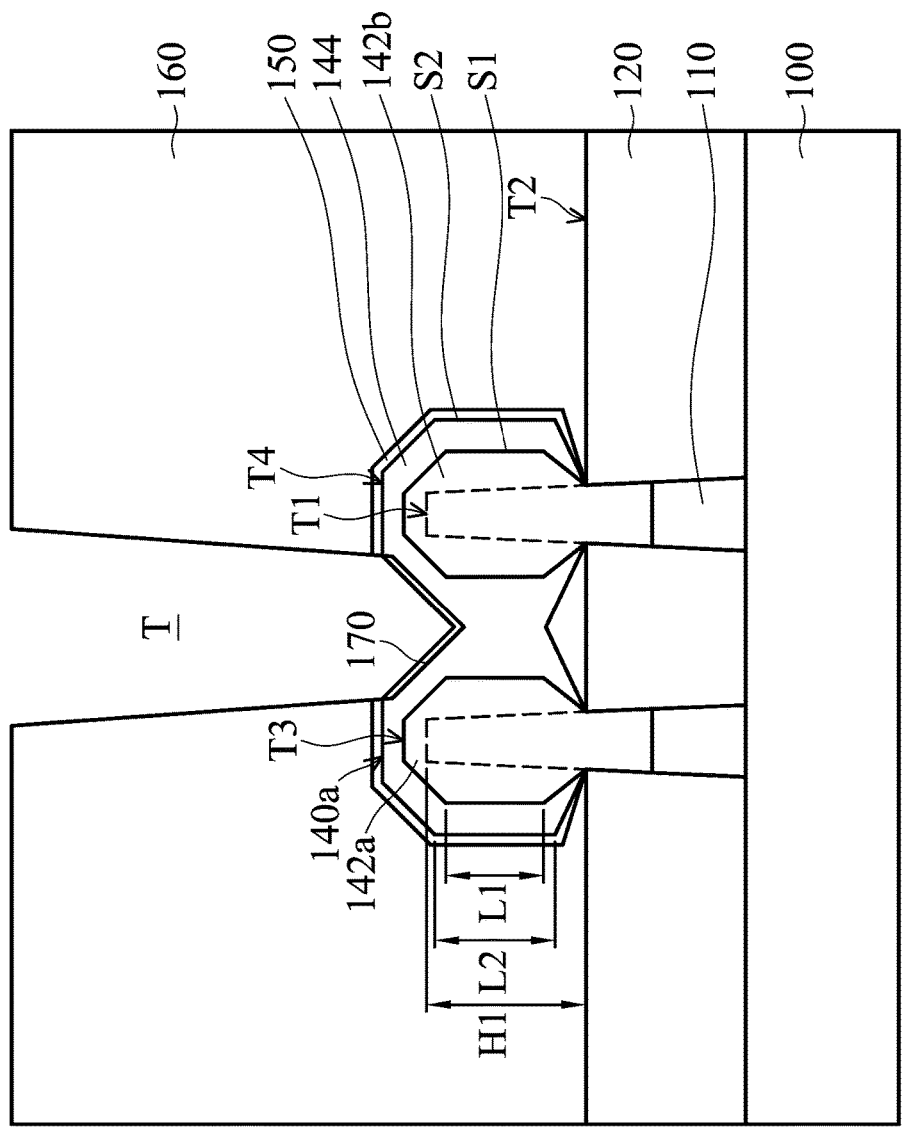

After the etching process is performed, a silicide layer 170 is formed over the S/D structure 140a as shown in FIG. 2H in accordance with some embodiments. In some embodiments, the surface of the S/D structure 140a exposed by the dielectric layer 160 is covered by the silicide layer 170, as shown in FIG. 2H. In some embodiments, as shown in FIG. 2H, the silicide layer 170 extends from top surfaces T4 of the semiconductor layer 144 to under the top surfaces T3 of the semiconductor layer 142a and the semiconductor layer 142b. More specifically, a portion of the silicide layer 170 is lower than the top surfaces T3 of the semiconductor layer 142a and the semiconductor layer 142b. In some embodiments, the silicide layer 170 extends from top surfaces T4 of the semiconductor layer 144 to under the top surfaces T1 of the fin structures 110 covered by the gate structure 130. In some embodiments, the silicide layer 170 has a V-shaped profile.

In some embodiments, as shown in FIG. 2H, the silicide layer 170 is direct contact with the semiconductor layer 144 which has greater second dopant concentration of the dopant, and the semiconductor layer 142a and the semiconductor layer 142b are separated from the silicide layer 170 by the semiconductor layer 144. Since the silicide layer 170 adjoins the semiconductor layer 144 with greater dopant concentration of the dopant, the gain of the semiconductor device structure can be improved.

In some embodiments, a metal layer is deposited over the S/D structure 140a, and an anneal process is performed to form the silicide layer 170. In some embodiments, the metal layer is made of or includes titanium, cobalt, tungsten, nickel or a combination thereof. In some embodiments, the metal layer is deposited using a PVD process such as a sputtering process, a CVD process, a spin-on process, another applicable process, or a combination thereof.

Figure 2I:
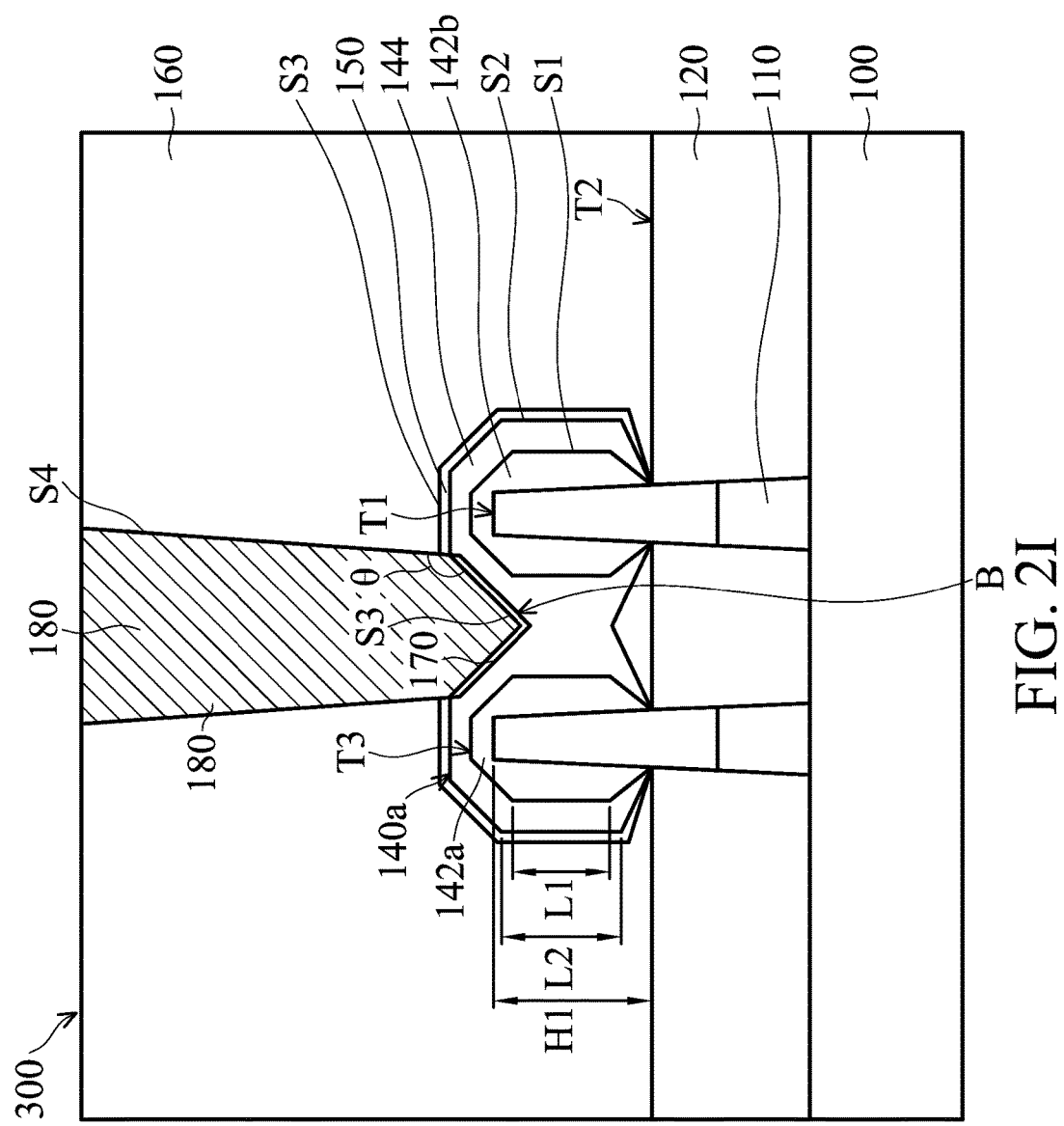

After the silicide layer 170 is formed, a conductive material is filled into the trench T to form a contact 180, and a semiconductor device structure 300 is created, as shown in FIG. 2I in accordance with some embodiments. As shown in FIG. 2I, the contact 180 is electrically connected to the S/D structure 140a through the silicide layer 170.

In some embodiments, a conductive material layer is deposited over the dielectric layer 160 to fill the trench T. A planarization process is subsequently used to remove portions of the conductive material layer outside of the trench T. As a result, the remaining portions of the conductive material layer in the trench T form the contact 180. In some embodiments, the contact 180 adjoins the silicide layer 170.

As shown in FIG. 2I, the contact 180 has a V-shaped bottom B, and the bottom B of the contact 180 has tapered sidewalls. In some embodiments, the bottom B of the contact 180 is lower than the top surfaces T3 of the semiconductor layer 142a and the semiconductor layer 142b. In some embodiments, the bottom B of the contact 180 is lower than the top surfaces T1 of the fin structures 110 covered by the gate structure 130. Since the semiconductor layer 144 has the wavy-shaped recess R between the semiconductor layer 142a and the semiconductor layer 142b, the greater interface is formed between the contact 180 and the S/D structure 140a. As a result, the contact resistance is decreased, and the gain of the semiconductor device structure can be improved. In some embodiments, the contact 180 has a surface S3 over the silicide layer 170, and has a surface S4 over the surface S3. As shown in FIG. 2I, the surface S3 is not parallel to the surface S4. More specifically, the surface S3 is not level with the surface S4. In some embodiments, as shown in FIG. 2I, an angle θ between the surface S3 and the surface S4 is in a range of about 105° to about 150°.

In some embodiments, the conductive material layer is made of tungsten, aluminum, copper, gold, platinum, titanium, another suitable material, or a combination thereof. In some embodiments, the conductive material layer is deposited using a CVD process, a PVD process, an electroplating process, an electroless plating process, another applicable process, or a combination thereof.

In some embodiments, the semiconductor layer 142a, the semiconductor layer 142b and the semiconductor layer 144 are grown at the temperature in a range of about 400° C. to about 700° C. As a result, the semiconductor layer 142a, the semiconductor layer 142b and the semiconductor layer 144 have surfaces (e.g. surface S1 and surface S2) with [110] plane orientation. Since the surface with [110] plane orientation is substantially parallel to the Z-axis, the S/D structure 140a with surfaces with [110] plane orientation formed in two opposite sides can have a smaller width. Therefore, the size of the semiconductor device structure can be decreased.

As described previously, the semiconductor layer 142a is separated from the semiconductor layer 142b by the semiconductor layer 144, and the semiconductor layer 144 has a wavy-shaped recess between the semiconductor layer 142a and the semiconductor layer 142b. Therefore, a greater interface between the S/D structure 140a and the contact 180 is formed. In addition, the contact 180 is in direct contact with the semiconductor layer 144 which has greater dopant concentration of the dopant. Therefore, the gain of the semiconductor device structure is improved.

Figure 3A:
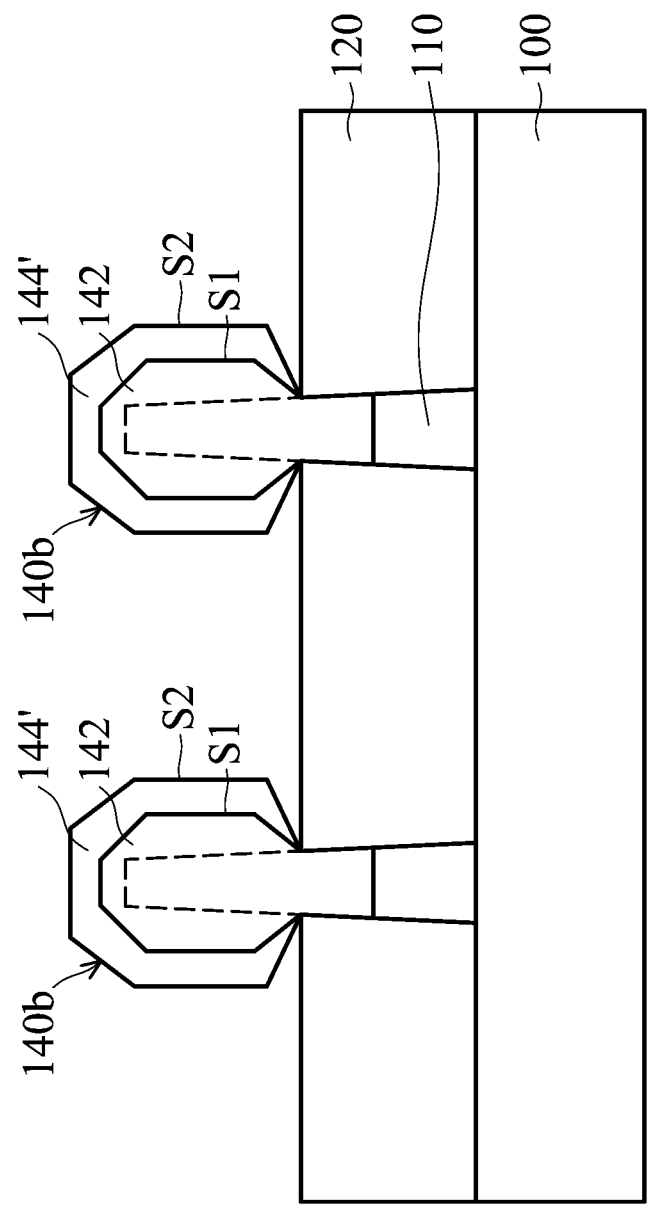
FIGS. 3A-3B are cross-sectional views of various stages of a process for forming a semiconductor device structure, in accordance with some embodiments.
Figure 3B:
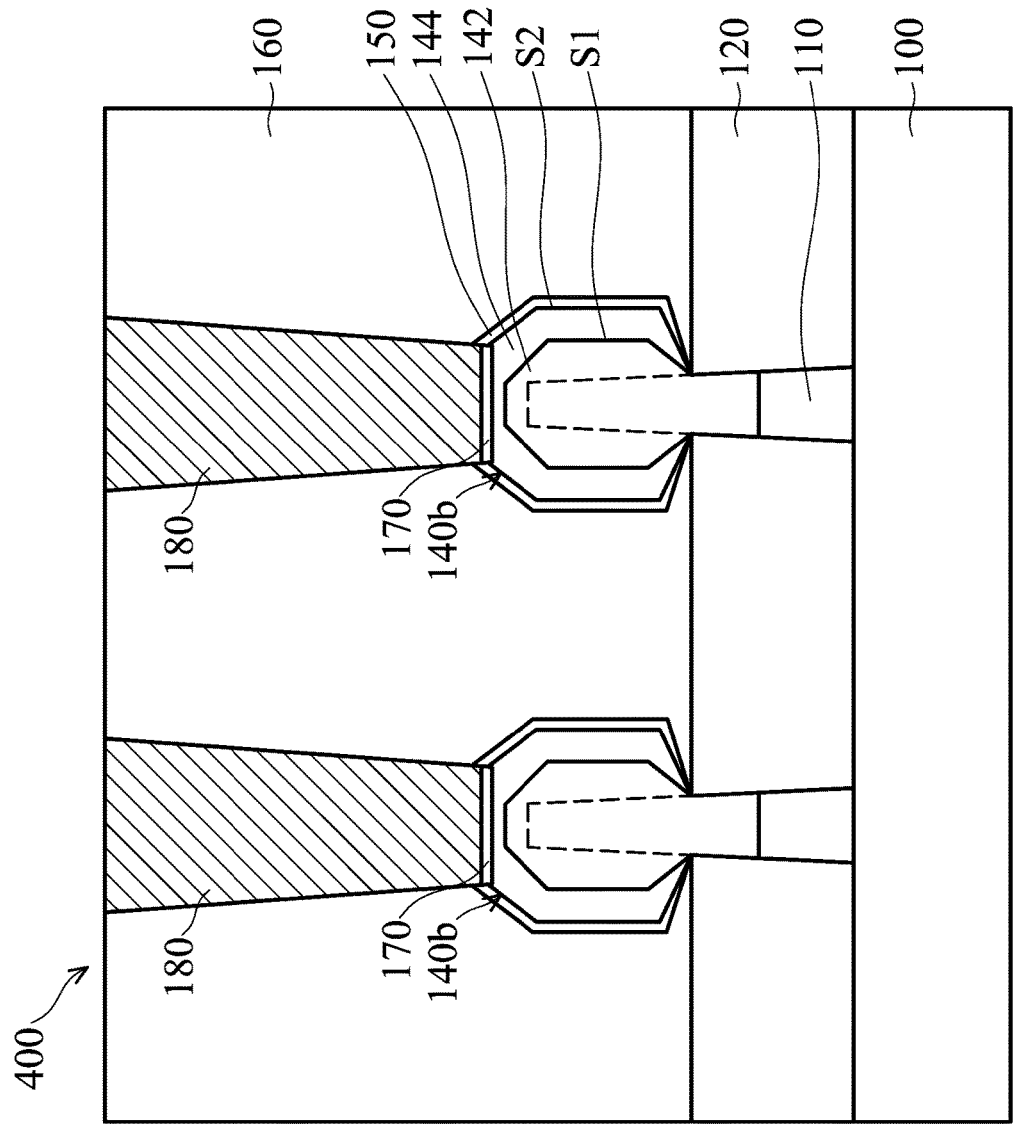

Many variations and/or modifications can be made to embodiments of the disclosure. In some embodiments, the S/D structure only covers one fin structure. FIGS. 3A-3B are cross-sectional views of various stages of a process for forming a semiconductor structure 400 after performing the stage of the process for forming a semiconductor structure 300 shown in FIG. 2C. The materials, configurations, structures and/or processes of the semiconductor structure 400 may be similar to, or the same as, those of the semiconductor structure 300, and the details thereof are not repeated herein.

S/D structures 140b are formed over the fin structures 110 as shown in FIG. 3A in accordance with some embodiments. In some embodiments, every S/D structure 140b includes one semiconductor layer 142 and one semiconductor layer 144'. As shown in FIG. 3A, the semiconductor layers 142 are grown in the recesses of the fin structures 110, and the semiconductor layers 144' are grown over one semiconductor layer 142. In some embodiments, every semiconductor layer 144' covers one fin structure 110. More specifically, one S/D structure 140b only covers one fin structure 110, and the semiconductor layers over different fin structures are separated from each other.

The semiconductor layer 142 has a first dopant concentration of the dopant, and the semiconductor layer 144' has a second dopant concentration of the dopant that is greater than the first dopant concentration of the dopant. Many variations and/or modifications can be made to embodiments of the disclosure. In some embodiments, the S/D structure 140b includes more semiconductor layers, and each of the semiconductor layer may have different dopant concentration of the dopant. For example, the S/D structure 140b has semiconductor layers with greater dopant concentration of the dopant in the outer layers, and has semiconductor layers with a lower dopant concentration of the dopant in the inner layers.

In some embodiments, the semiconductor layers 142 and the semiconductor layers 144' are grown at the temperature in a range of about 400° C. to about 700° C. As described previously, when the semiconductor layers 142 and the semiconductor layers 144' are grown at the temperature in a range of about 400° C. to about 700° C., the semiconductor layers 142a and the semiconductor layers 144' have surfaces (e.g. surface S1 and surface S2) with [110] plane orientation as shown in FIG. 3A. In some embodiments, each of the S/D structures 140b has two opposite surfaces with [110] plane orientation.

After the S/D structures 140b are formed, the capping layer 150, the dielectric layer 160, the capping layer 160 and the contact 180 are formed as shown in FIG. 3B in accordance with some embodiments. As a result, a semiconductor device structure 400 is created. The materials, configurations, structures and/or processes from the structure shown in FIG. 3A to the structure shown in FIG. 3B may be similar to, or the same as, those of the process from the structure shown in FIG. 2D to the structure shown in FIG. 2I, and the details thereof are not repeated herein.

As shown in FIG. 3B, the semiconductor device structure 400 has S/D structures 140b with two surfaces with [110] plane orientation. Since the surface with [110] plane orientation is substantially parallel to the Z-axis, the S/D structures 140b with surfaces with [110] plane orientation formed in two opposite sides can have a smaller width. Therefore, the size of the semiconductor device structure 400 can be decreased.

Moreover, since the semiconductor layers 142 and the semiconductor layers 144' are grown at the temperature that is lower than about 700° C., the surfaces with [111] plane orientation are not formed on side surfaces of the S/D structure 140b. As a result, the S/D structure developing an asymmetrical shape may be prevented, and the critical dimension (CD) uniformity may be improved. As a result, the manufacturing yield of the semiconductor device structure 400 may be improved.

Embodiments of the disclosure can be applied to not only a semiconductor device structure with N-type or P-type transistors but also a semiconductor device structure with complementary transistors or other suitable devices. Embodiments of the disclosure are not limited and may be applied to fabrication processes for any suitable technology generation. Various technology generations include a 16 nm node, a 10 nm node, a 7 nm node, or another suitable node.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In accordance with some embodiments, a semiconductor device structure is provided. The semiconductor device structure includes a first fin structure and a second fin structure over a substrate. The semiconductor device structure also includes a gate structure over the first and second fin structure. The semiconductor device structure further includes a source/drain structure over the first and second fin structure. The source/drain structure includes a first semiconductor layer over the first fin structure and a second semiconductor layer over the second fin structure. The source/drain structure also includes a third semiconductor layer covering the first and second semiconductor layers. The third semiconductor layer has a surface with [110] plane orientation.

In accordance with some embodiments, a semiconductor device structure is provided. The semiconductor device structure includes a first fin structure and a second fin structure over a substrate. The semiconductor device structure also includes a gate structure over the first fin structure and the second fin structure. The first fin structure has a top surface covered by the gate structure. The semiconductor device structure further includes a source/drain structure over portions of the first fin structure and the second fin structure not covered by the gate structure. The source/drain structure includes a first semiconductor layer over the first fin structure. The source/drain structure also includes a second semiconductor layer over the second fin structure. The source/drain structure further includes a third semiconductor layer covering the first semiconductor layer and the second semiconductor layer. A composition of the third semiconductor layer is different from a composition of the first semiconductor layer and the second semiconductor layer. In addition, the semiconductor device structure includes and a contact over the third semiconductor layer. A bottom of the contact is lower than the top surface of the first fin structure.

In accordance with some embodiments, a method for forming a semiconductor device structure is provided. The method includes forming a first fin structure over a substrate. The method also includes forming a gate structure over the first fin structure. The method further includes recessing the first fin structure to form a first recess adjacent to the gate structure. In addition, the method includes epitaxially growing a first semiconductor layer in the first recess of the first fin structure at a first temperature in a range of about 400° C. to about 700° C. so that the first semiconductor layer has a surface with [110] plane orientation. The first semiconductor layer has a first dopant concentration of P.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device structure, comprising:
    forming a first fin structure over a substrate;
    forming an isolation feature over the substrate;
    forming a gate structure over the first fin structure and the isolation feature;
    recessing a portion of the first fin structure that is not directly below the gate structure to form a first recess extending into a portion of the isolation feature that is not directly below the gate structure;
    epitaxially growing a first semiconductor layer in the first recess of the first fin structure at a first temperature in a range of about 400° C. to about 700° C. so that the first semiconductor layer has a surface with [110] plane orientation, wherein the first semiconductor layer has a first dopant concentration of P;
    epitaxially growing a second semiconductor layer covering the first semiconductor layer;
    forming a second fin structure adjacent to the first fin structure;
    recessing the second fin structure to form a second recess adjacent to the gate structure; and
    epitaxially growing a third semiconductor layer in the second recess of the second fin structure at the first temperature so that the third semiconductor layer has a surface with [110] plane orientation, wherein the first semiconductor layer is separated from the third semiconductor layer by the second semiconductor layer, and wherein the surface of the first semiconductor layer with [110] plane orientation and the surface of the third semiconductor layer with [110] plane orientation face toward each other.

2. The method as claimed in claim 1,
    wherein the second semiconductor layer is grown at the first temperature so that the second semiconductor layer has a surface with [110] plane orientation, and wherein the second semiconductor layer has a second dopant concentration of P that is greater than the first dopant concentration of P.

3. The method as claimed in claim 1,
wherein the third semiconductor layer has the first dopant concentration of P, the second semiconductor layer has a recess formed between the first semiconductor layer and the third semiconductor layer, and a bottom of the recess is lower than a top surface of the first semiconductor layer.

4. The method as claimed in claim 3, further comprising:
depositing a dielectric layer over the third semiconductor layer;
etching the dielectric layer and a portion of the third semiconductor layer to form a trench, wherein a bottom of the trench is lower than the top surface of the first semiconductor layer; and
forming a contact to fill the trench.

5. The method as claimed in claim 1, further comprising:
forming a contact over the second semiconductor layer, wherein a bottom of the contact is lower than a top surface of the first semiconductor layer and a top surface of the third semiconductor layer.

6. A method for fabricating a semiconductor device structure, comprising:
forming a first fin structure over a substrate;
forming an isolation feature over the substrate, wherein the first fin structure has a first height over the isolation feature;
forming a gate structure over the first fin structure;
recessing the first fin structure to form a first recess adjacent to the gate structure;
epitaxially growing a first semiconductor layer in the first recess of the first fin structure so that the first semiconductor layer has a surface with [110] plane orientation, wherein the surface of the first semiconductor layer has a first length perpendicular to a top surface of the substrate;
epitaxially growing a second semiconductor layer covering the first semiconductor layer so that the second semiconductor layer has a surface with [110] plane orientation;
forming a capping layer over the second semiconductor layer;
forming a dielectric layer over the capping layer; and
etching the dielectric layer, the capping layer and a portion of the second semiconductor layer to form a trench, wherein a bottommost portion of the trench is lower than a top surface of the first semiconductor layer.

7. The method as claimed in claim 6, wherein the surface of the second semiconductor layer has a second length perpendicular to the top surface of the substrate, and wherein a ratio of the first length to the first height is in a range from about 40% to about 70%, and a ratio of the second length to the first height is in a range from about 50% to about 80%.

8. The method as claimed in claim 6, further comprising:
forming a second fin structure over the substrate, wherein the second fin structure has a second height over the isolation feature, and a portion of the second fin structure is covered by the gate structure;
recessing the second fin structure to form a second recess adjacent to the gate structure;
epitaxially growing a third semiconductor layer in the second recess of the second fin structure at a temperature in a range from about 400° C. to about 700° C. so that the third semiconductor layer has a surface with [110] plane orientation, wherein the surface of the second semiconductor layer has a third length perpendicular to the top surface of the substrate, and a ratio of the third length to the second height is in a range from about 40% to about 70%, and
wherein the third semiconductor layer is covered by the second semiconductor layer.

9. The method as claimed in claim 8, wherein the surface of the first semiconductor layer with [110] plane orientation and the surface of the third semiconductor layer with [110] plane orientation face toward each other.

10. The method as claimed in claim 6, wherein the first semiconductor layer has a first dopant concentration of P, and the second semiconductor layer has a second dopant concentration of P that is greater than the first dopant concentration of P.

11. The method as claimed in claim 10, wherein the growth process of the first semiconductor layer comprises:
applying $PH_3$, wherein a flow rate of $PH_3$ is in a range from about 100 sccm to about 400 sccm, and
wherein the first semiconductor layer and the second semiconductor layer are grown at a temperature in a range from about 400° C. to about 700° C.

12. The method as claimed in claim 10, wherein the first dopant concentration of P is in a range from about $1\times10^{20}/cm^3$ to $5\times10^{21}/cm^3$.

13. The method as claimed in claim 6, further comprising:
forming a silicide layer on a top surface of the second semiconductor layer exposed by the trench, wherein a bottom surface of the silicide layer is lower than the top surface of the first semiconductor layer; and
forming a contact over the silicide layer, wherein the contact has a V-shaped profile.

14. A method for fabricating a semiconductor device structure, comprising:
forming a first fin structure and a second fin structure over a substrate;
forming an isolation feature over the substrate, wherein the first fin structure has a first height over the isolation feature, and the second fin structure has a second height over the isolation feature;
forming a gate structure over the first fin structure and the second fin structure;
recessing the first fin structure and the second fin structure to form a first recess and a second recess adjacent to the gate structure;
epitaxially growing a first semiconductor layer in the first recess of the first fin structure and a second semiconductor layer in the second recess of the second fin structure, wherein a surface of the first semiconductor layer with [110] plane orientation has a first length perpendicular to a top surface of the substrate, and a surface of the second semiconductor layer with [110] plane orientation has a second length perpendicular to the top surface of the substrate, wherein the surface of the first semiconductor layer with [110] plane orientation and the surface of the second semiconductor layer with [110] plane orientation face toward each other; and
epitaxially growing a third semiconductor layer covering the first semiconductor layer and the second semiconductor layer, wherein the first semiconductor layer and the second semiconductor layer are separated by the third semiconductor layer.

15. The method as claimed in claim 14, wherein a first ratio of the first length to the first height and a second ratio of the second length to the second height are in a range from about 40% to about 70%.

16. The method as claimed in claim 14, wherein the first semiconductor layer and the second semiconductor layer have a first dopant concentration of a dopant, the third semiconductor layer has a second dopant concentration of the dopant that is greater than the first dopant concentration of the dopant, and the dopant comprises P, As, B, Al or Ga.

17. The method as claimed in claim 14, wherein the growth process of the first semiconductor layer and the second semiconductor layer comprises:

applying a P-containing precursor at a temperature in a range from about 400° C. to about 700° C.

18. The method as claimed in claim 17, wherein the P-containing precursor comprises $PH_3$, and a flow rate of $PH_3$ is in a range from about 100 sccm to about 400 sccm.

19. The method as claimed in claim 14, wherein a surface of the third semiconductor layer with [110] plane orientation has a third length perpendicular to the top surface of the substrate, and a ratio of the third length to the first height is in a range from about 50% to about 80%.

20. The method as claimed in claim 14, further comprising:

forming a dielectric layer over the third semiconductor layer;

etching the dielectric layer and a portion of the third semiconductor layer to form a trench; and forming a contact to fill the trench, wherein the contact extends between the first semiconductor layer and the second semiconductor layer.

* * * * *